United States Patent
Chang et al.

(10) Patent No.: US 11,631,753 B2
(45) Date of Patent: Apr. 18, 2023

(54) SEMICONDUCTOR DEVICE AND METHOD FOR FABRICATING THE SAME

(71) Applicant: UNITED MICROELECTRONICS CORP., Hsin-Chu (TW)

(72) Inventors: Chung-Fu Chang, Tainan (TW);
Kuan-Hung Chen, Taichung (TW);
Guang-Yu Lo, New Taipei (TW);
Chun-Chia Chen, Tainan (TW);
Chun-Tsen Lu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 315 days.

(21) Appl. No.: 16/282,323

(22) Filed: Feb. 22, 2019

(65) Prior Publication Data
US 2020/0235227 A1    Jul. 23, 2020

(30) Foreign Application Priority Data

Jan. 22, 2019 (TW) .................................. 108102399

(51) Int. Cl.
| H01L 29/66 | (2006.01) |
| H01L 29/78 | (2006.01) |
| H01L 29/51 | (2006.01) |
| H01L 21/02 | (2006.01) |
| H01L 21/28 | (2006.01) |

(52) U.S. Cl.
CPC ...... *H01L 29/66795* (2013.01); *H01L 21/022* (2013.01); *H01L 21/0214* (2013.01); *H01L 21/02164* (2013.01); *H01L 21/28202* (2013.01); *H01L 29/511* (2013.01); *H01L 29/785* (2013.01); *H01L 29/7834* (2013.01)

(58) Field of Classification Search
None
See application file for complete search history.

(56) References Cited

U.S. PATENT DOCUMENTS

| 6,900,092 B2 | 5/2005 | Ajmera et al. |
| 2019/0164966 A1 * | 5/2019 | Wang ............. H01L 21/823814 |

FOREIGN PATENT DOCUMENTS

| TW | 201731106 A | 9/2017 |
| TW | 201820623 A | 6/2018 |
| TW | 201824555 A | 7/2018 |

* cited by examiner

*Primary Examiner* — Kenneth Parker
*Assistant Examiner* — Christopher A Culbert
(74) *Attorney, Agent, or Firm* — Winston Hsu

(57) ABSTRACT

A method for fabricating semiconductor device includes the steps of: forming a fin-shaped structure on a substrate; forming a gate dielectric layer on the fin-shaped structure; forming a gate electrode on the fin-shaped structure; performing a nitridation process to implant ions into the gate dielectric layer adjacent to two sides of the gate electrode; and forming an epitaxial layer adjacent to two sides of the gate electrode.

4 Claims, 2 Drawing Sheets

SEMICONDUCTOR DEVICE AND METHOD FOR FABRICATING THE SAME

BACKGROUND OF THE INVENTION

1. Field of the Invention

The invention relates to a method for fabricating semiconductor device, and more particularly, to a method of conducting nitridation process to implant ions into gate dielectric layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the fin FET can be controlled by adjusting the work function of the gate.

In current FinFET fabrication process, part of the gate dielectric layer may be lost during the formation of epitaxial layer thereby resulting in worsened capacitance overlap ($C_{ov}$) issue between the gate structure and the source/drain region. Hence, how to improve the current FinFET fabrication and structure for resolving this issue has become an important task in this field.

SUMMARY OF THE INVENTION

According to an embodiment of the present invention, a method for fabricating semiconductor device includes the steps of: forming a fin-shaped structure on a substrate; forming a gate dielectric layer on the fin-shaped structure; forming a gate electrode on the fin-shaped structure; performing a nitridation process to implant ions into the gate dielectric layer adjacent to two sides of the gate electrode; and forming an epitaxial layer adjacent to two sides of the gate electrode.

According to another aspect of the present invention, a semiconductor device includes: a fin-shaped structure extending along a first direction on a substrate; a gate electrode extending along a second direction on the fin-shaped structure; and a gate dielectric layer extending along the first direction between the fin-shaped structure and the gate electrode. Preferably, the gate dielectric layer comprises a first portion directly under the gate electrode and a second portion adjacent to two sides of the gate electrode.

According to yet another aspect of the present invention, a semiconductor device includes: a fin-shaped structure extending along a first direction on a substrate; a gate electrode extending along a second direction on the fin-shaped structure; and an epitaxial layer adjacent to two sides of the gate electrode. Preferably, the epitaxial layer comprises a hexagon and a protruding portion.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
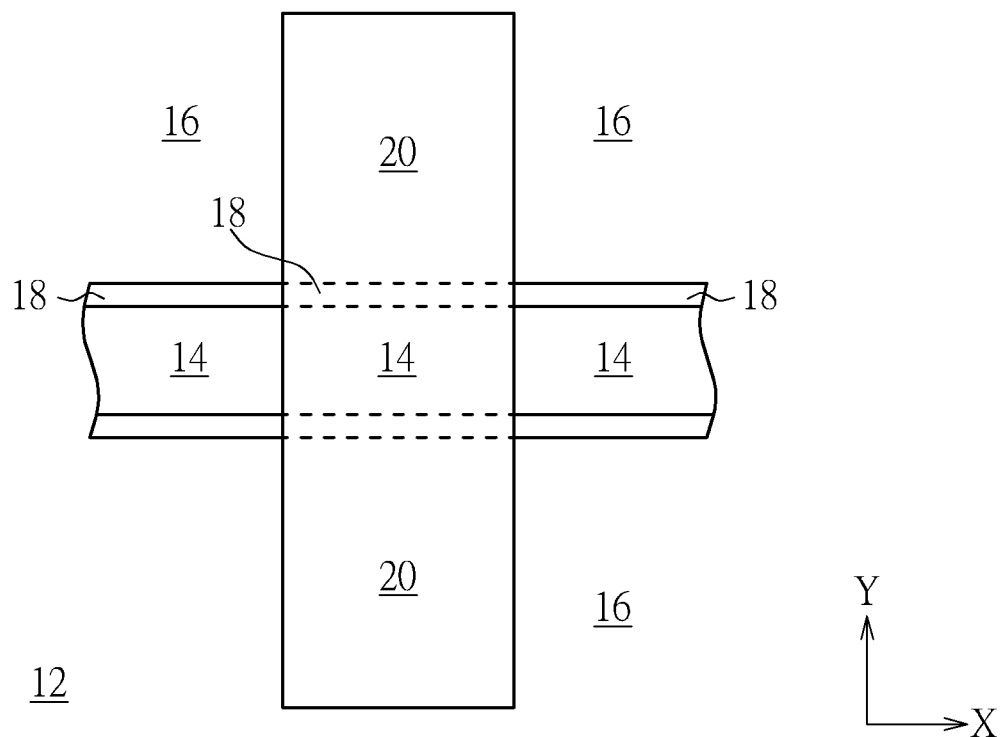
FIGS. 1-4 illustrate a method for fabricating a semiconductor device from a top view perspective according to an embodiment of the present invention.

Referring to FIGS. 1-4, FIGS. 1-4 illustrate a method for fabricating a semiconductor device from a top view perspective according to an embodiment of the present invention. As shown in FIG. 1, a substrate 12, such as a silicon substrate or silicon-on-insulator (SOI) substrate is first provided, and at least a transistor region such as a NMOS region or a PMOS region are defined on the substrate 12. Next, at least a fin-shaped structure 14 is formed on the substrate 12, in which the bottom of the fin-shaped structure 14 is surrounded by an insulating layer or shallow trench isolation (STI) made of material including but not limited to for example silicon oxide.

According to an embodiment of the present invention, the fin-shaped structure 14 could be obtained by a sidewall image transfer (SIT) process. For instance, a layout pattern is first input into a computer system and is modified through suitable calculation. The modified layout is then defined in a mask and further transferred to a layer of sacrificial layer on a substrate through a photolithographic and an etching process. In this way, several sacrificial layers distributed with a same spacing and of a same width are formed on a substrate. Each of the sacrificial layers may be stripe-shaped. Subsequently, a deposition process and an etching process are carried out such that spacers are formed on the sidewalls of the patterned sacrificial layers. In a next step, sacrificial layers can be removed completely by performing an etching process. Through the etching process, the pattern defined by the spacers can be transferred into the substrate underneath, and through additional fin cut processes, desirable pattern structures, such as stripe patterned fin-shaped structures could be obtained.

Alternatively, the fin-shaped structure 14 could also be obtained by first forming a patterned mask (not shown) on the substrate, 12, and through an etching process, the pattern of the patterned mask is transferred to the substrate 12 to form the fin-shaped structure. Moreover, the formation of the fin-shaped structure could also be accomplished by first forming a patterned hard mask (not shown) on the substrate 12, and a semiconductor layer composed of silicon germanium is grown from the substrate 12 through exposed patterned hard mask via selective epitaxial growth process to form the corresponding fin-shaped structure. These approaches for forming fin-shaped structure are all within the scope of the present invention.

Next, an oxidation process such as an in-situ steam generation (ISSG) process could be conducted on to surface of the fin-shaped structure 14 to form a gate dielectric layer 18 on the top surface and sidewalls of the fin-shaped structure 14, and then a gate structure or gate electrode 20 preferably made of polysilicon is formed crossing the fin-shaped structure 14. As shown by the top view in FIG. 1, the fin-shaped structure 14 is extended along a first direction (such as X-direction) on the substrate 12, the gate dielectric layer 18 covering on the top surface and two sidewalls of the fin-shaped structure 14 is also extending along the same first direction (such as X-direction) on the substrate 12, and the gate electrode 20 is extended along a second direction (such as Y-direction) on the fin-shaped structure 14.

Figure 2:
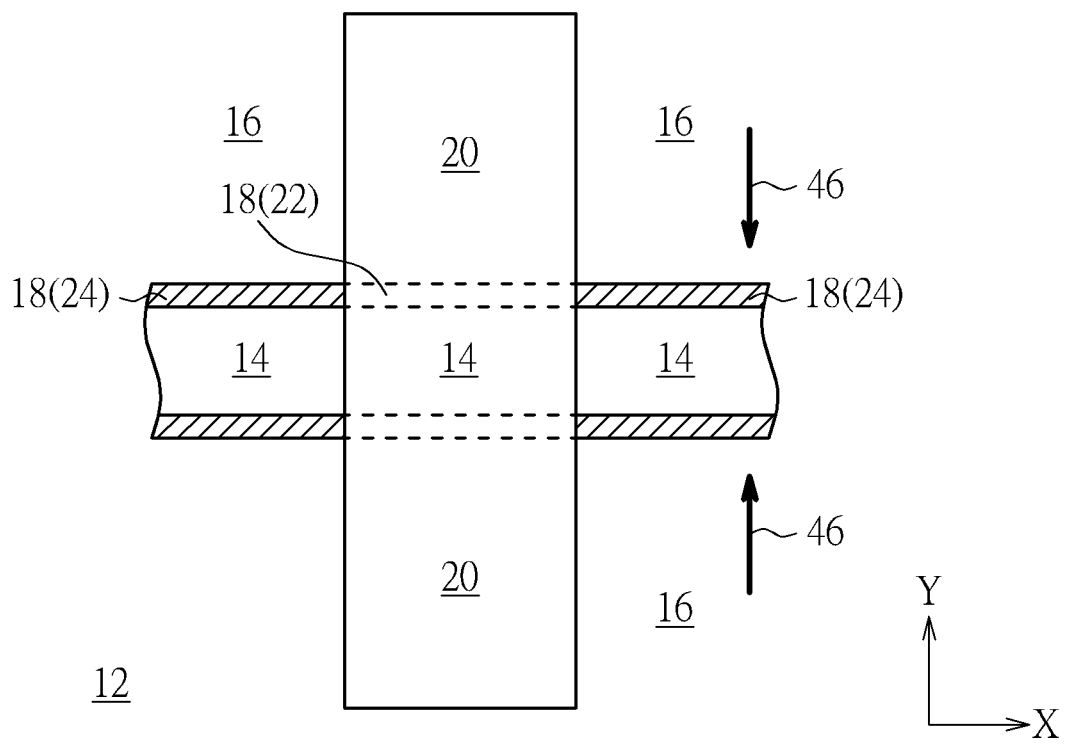

Next, as shown in FIG. 2, a nitridation process 46 is conducted to implant or inject ions into the gate dielectric layer 18 and even STI 18 adjacent to two sides of the gate electrode 20. Specifically, the nitridation process 46 is conducted by using the patterned gate electrode 20 directly as mask to implant nitrogen ions into the fin-shaped structure 14, gate dielectric layer 18, and STI 16 adjacent to two sides of the gate electrode 20 without forming additional patterned mask. This divides the gate dielectric layer 18 into a first portion 22 directly under the gate electrode 20 and a second portion 24 adjacent to two sides of the gate electrode 20, in which the first portion 22 and the second portion 24 are preferably made of different materials. Viewing from a more detailed perspective, the first portion 22 directly under the gate electrode 20 not being implanted with nitrogen ion is preferably made of silicon oxide (SiO) after the nitridation process, whereas the second portion 24 and STI 16 adjacent to two sides of the gate electrode 20 being implanted with nitrogen ions are preferably made of silicon oxynitride (SiON) after the nitridation process 46. In this embodiment, the nitridation process 46 could include but not limited to for example remote thermal nitridation (RTN) process or decoupled plasma nitridation process (DPN) process and most preferably include DPN process.

Figure 3:
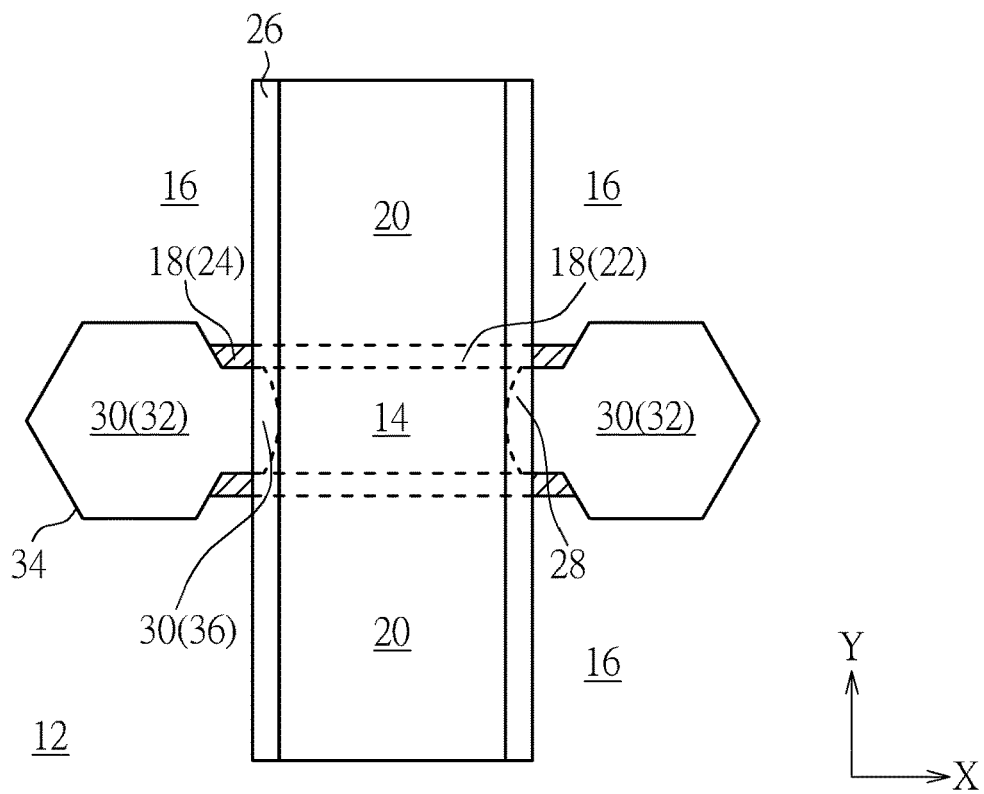

Next, as shown in FIG. 3, at least a spacer 26 is formed on the sidewalls of the gate electrode 20, and then a lightly doped drain (LDD) 28 is formed in the fin-shaped structure 14 and/or substrate 12 adjacent to two sides of the spacer 26. Next, another selective spacer (not shown) could be formed on the sidewalls of the spacer 26, the gate dielectric layer 18 and part of the fin-shaped structure 14 adjacent to two sides of the spacer 26 are removed to form a recess (not shown), an epitaxial layer 30 and source/drain region 32 are formed in the recess, and a silicide (not shown) could be selectively formed on the surface of the epitaxial layer 30. It should be noted that since the aforementioned nitridation process 46 could lower the etching rate of etchant such as hydrofluoric acid (dHF) or SiCoNi during the formation of the recess, part of the gate dielectric layer 18 (in particular the aforementioned second portion 24) between the gate electrode 20 and epitaxial layer 30 would not be removed during the formation of the recess and the capacitance overlap ($C_{ov}$) between the gate structure and the source/drain region could thereby be improved substantially. Accordingly, the epitaxial layer grown through the epitaxial growth process in the recess adjacent to two sides of the gate electrode 20 if viewed from a top view perspective preferably includes a hexagon 34 and a protrusion or protruding portion 36 attached to the end of the hexagon 30 and extended toward the direction of the gate electrode 20. Preferably, it is to be noted that the SiCoNi process is commonly conducted by reacting fluorine-containing gas with silicon oxide to form $((NH_4)_2SiF_6)$ thereby removing native oxide, in which the fluorine-containing gas could include HF or $NF_3$.

In this embodiment, the spacer 26 could be a single spacer or a composite spacer, such as a spacer including but not limited to for example an offset spacer and a main spacer. Preferably, the offset spacer and the main spacer could include same material or different material while both the offset spacer and the main spacer could be made of material including but not limited to for example $SiO_2$, SiN, SiON, SiCN, or combination thereof. The lightly doped drain 28 and source/drain region 32 could include different dopants and/or different epitaxial materials depending on the type of device being fabricated. For instance, the source/drain region 32 on a NMOS region could include silicon carbide (SiC) or silicon phosphide (SiP) whereas the source/drain region 32 on a PMOS region could include silicon germanium (SiGe), but not limited thereto.

Figure 4:
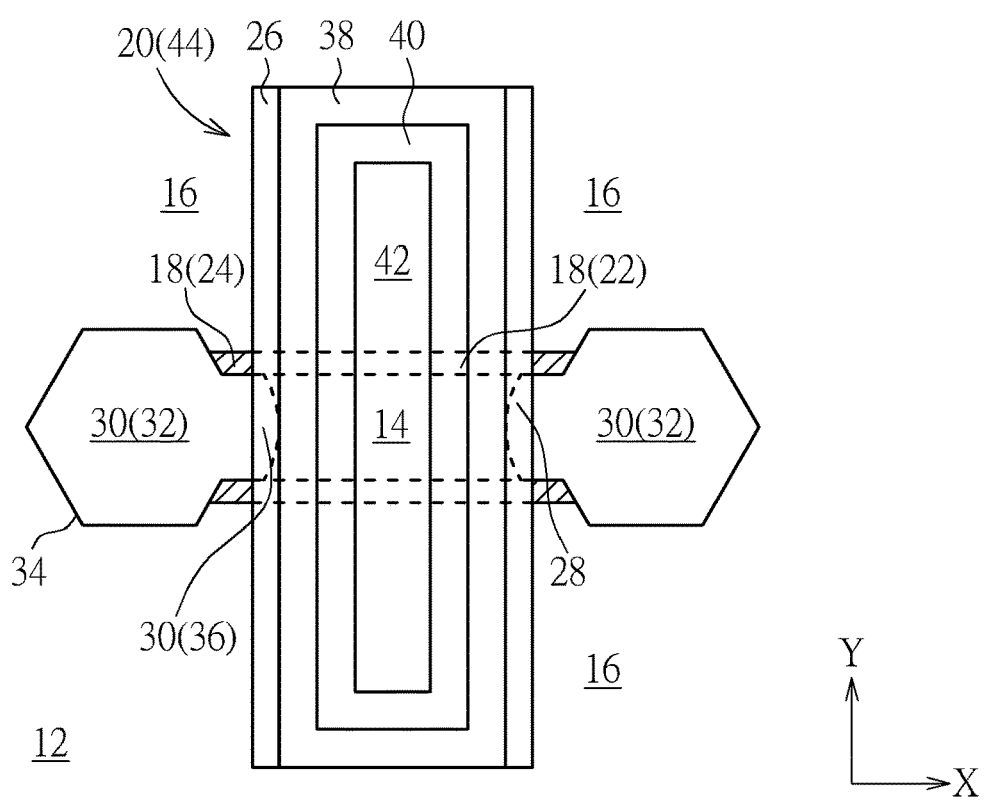

Next, as shown in FIG. 4, an interlayer dielectric (ILD) layer (not shown) is formed on the gate electrode 20, and a planarizing process such as chemical mechanical polishing (CMP) process is conducted to remove part of the ILD layer and expose the surface of the gate electrode 20 made of polysilicon so that the top surfaces of the gate electrode 20 and ILD layer are coplanar.

Next, a replacement metal gate (RMG) process is conducted to transform the gate electrode into metal gate. For instance, the RMG process could be accomplished by first performing a selective dry etching or wet etching process using etchants including but not limited to for example ammonium hydroxide ($NH_4OH$) or tetramethylammonium hydroxide (TMAH) to remove the gate electrode 20 made of polysilicon to form a recess in the ILD layer. Next, a high-k dielectric layer 38, a work function metal layer 40, and a low resistance metal layer 42 are formed in the recess, and a planarizing process such as CMP is conducted to remove part of low resistance metal layer 42, part of work function metal layer 40, and part of high-k dielectric layer 38 to form gate electrode 20 made of metal gate 44. In this embodiment, the metal gate 44 fabricated through a high-k last process preferably includes a gate dielectric layer 18, a high-k dielectric layer 38, a work function metal layer 40, and a low resistance metal layer 42, in which the high-k dielectric layer 38 and work function metal layer 40 if viewed from the top view perspective shown in FIG. 4 include a ring-shape.

In this embodiment, the high-k dielectric layer 38 is preferably selected from dielectric materials having dielectric constant (k value) larger than 4. For instance, the high-k dielectric layer 38 may be selected from hafnium oxide ($HfO_2$), hafnium silicon oxide ($HfSiO_4$), hafnium silicon oxynitride (HfSiON), aluminum oxide ($Al_2O_3$), lanthanum oxide ($La_2O_3$), tantalum oxide ($Ta_2O_5$), yttrium oxide ($Y_2O_3$), zirconium oxide ($ZrO_2$), strontium titanate oxide ($SrTiO_3$), zirconium silicon oxide ($ZrSiO_4$), hafnium zirconium oxide ($HfZrO_4$), strontium bismuth tantalate ($SrBi_2Ta_2O_9$, SBT), lead zirconate titanate ($PbZr_xTi_{1-x}O_3$, PZT), barium strontium titanate ($Ba_xSr_{1-x}TiO_3$, BST) or a combination thereof.

In this embodiment, the work function metal layer 40 is formed for tuning the work function of the metal gate in accordance with the conductivity of the device. For an NMOS transistor, the work function metal layer 40 having a work function ranging between 3.9 eV and 4.3 eV may include titanium aluminide (TiAl), zirconium aluminide (ZrAl), tungsten aluminide (WAl), tantalum aluminide (TaAl), hafnium aluminide (HfAl), or titanium aluminum carbide (TiAlC), but it is not limited thereto. For a PMOS transistor, the work function metal layer 40 having a work function ranging between 4.8 eV and 5.2 eV may include titanium nitride (TiN), tantalum nitride (TaN), tantalum carbide (TaC), but it is not limited thereto. An optional barrier layer (not shown) could be formed between the work function metal layer 40 and the low resistance metal layer 42, in which the material of the barrier layer may include titanium (Ti), titanium nitride (TiN), tantalum (Ta) or tantalum nitride (TaN). Furthermore, the material of the low-resistance metal layer 42 may include copper (Cu), aluminum (Al), titanium aluminum (TiAl), cobalt tungsten phosphide (CoWP) or any combination thereof.

Referring again to FIGS. 3-4, FIGS. 3-4 illustrate structural top view of a semiconductor device according to an embodiment of the present invention. As shown in FIGS. 3-4, the semiconductor device preferably includes a fin-shaped structure 14 extending along a first direction (such as X-direction) on the substrate 12, a gate electrode 20 extending along a second direction (such as Y-direction) on the fin-shaped structure 14, a spacer 26 disposed on sidewalls of the gate electrode 20, a gate dielectric layer 18 extending along the same first direction between the fin-shaped structure 14 and gate electrode 20, and an epitaxial layer 30 disposed adjacent to two sides of the gate electrode 20.

Viewing from a more detailed perspective, the gate dielectric layer 18 preferably includes a first portion 22 disposed directly under the gate electrode 20 and a second portion 24 (slanted portion in FIGS. 3-4) adjacent to two sides of the gate electrode 20 or more specifically between the first portion 22 and the epitaxial layer 30, in which the first portion 22 and the second portion 24 are made of different materials. For instance, the first portion 22 is preferably made of silicon oxide while the second portion 24 is made of SiON. Moreover, the epitaxial layer 30 preferably includes a hexagon 34 and a protruding portion 36 on the end of the hexagon 34, in which the protruding portion 36 is disposed between the hexagon 34 and the fin-shaped structure 14 and extending along a first direction (such as X-direction) toward the fin-shaped structure 14. The hexagon 34 and the protruding portion 36 are formed in the same step and are preferably made of same material such as SiGe or SiC.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor device, comprising:
   a fin-shaped structure extending along a first direction on a substrate;
   a gate electrode extending along a second direction on the fin-shaped structure;
   a spacer extending along the second direction adjacent to the gate electrode; and
   an epitaxial layer adjacent to two sides of the gate electrode and the spacer, wherein the epitaxial layer comprises a hexagon under a top view perspective and a protruding portion between the hexagon and the gate electrode and directly under the spacer and the hexagon and the protruding portion are consisted of semiconductor material.

2. The semiconductor device of claim 1, wherein the protruding portion is between the hexagon and the fin-shaped structure.

3. The semiconductor device of claim 1, wherein the protruding portion is extended toward the fin-shaped structure along the first direction.

4. The semiconductor device of claim 1, wherein the first direction is orthogonal to the second direction.

* * * * *